United States Patent
Sun et al.

(10) Patent No.: US 10,900,995 B2
(45) Date of Patent: Jan. 26, 2021

(54) TRI-AXIAL MEMS ACCELEROMETER

(71) Applicant: Chinese Academy of Sciences Institute of Geology and Geophysics, Beijing (CN)

(72) Inventors: Chen Sun, Beijing (CN); Lian Zhong Yu, Beijing (CN)

(73) Assignee: CHINESE ACADEMY OF SCIENCES INSTITUTE OF GEOLOGY AND GEOPHYSICS, Beijing (CN)

( * ) Notice: Subject to any disclaimer, the term of this patent is extended or adjusted under 35 U.S.C. 154(b) by 636 days.

(21) Appl. No.: 15/794,928

(22) Filed: Oct. 26, 2017

(65) Prior Publication Data
US 2018/0045753 A1 Feb. 15, 2018

Related U.S. Application Data

(62) Division of application No. 14/270,581, filed on May 6, 2014, now Pat. No. 9,829,504.

(30) Foreign Application Priority Data

May 16, 2013 (CN) .......................... 2013 1 0182168

(51) Int. Cl.
| | |
|---|---|
| *G01P 15/125* | (2006.01) |
| *G01P 15/08* | (2006.01) |
| *G01P 15/18* | (2013.01) |
| *H01L 21/3105* | (2006.01) |
| *H01L 21/02* | (2006.01) |
| *H01L 21/3065* | (2006.01) |

(52) U.S. Cl.
CPC ........ *G01P 15/125* (2013.01); *G01P 15/0802* (2013.01); *G01P 15/18* (2013.01); *H01L 21/02123* (2013.01); *H01L 21/02164* (2013.01); *H01L 21/3065* (2013.01); *H01L 21/31053* (2013.01)

(58) Field of Classification Search
CPC ......... H01L 21/02123; H01L 21/02164; H01L 21/31053; H01L 21/3065; G01P 15/125; G01P 15/0802; G01P 15/18
USPC ........... 438/719, 723, 724, 743, 744; 216/13
See application file for complete search history.

(56) References Cited

U.S. PATENT DOCUMENTS

| | | |
|---|---|---|
| 4,744,249 A | 5/1988 | Stewart |
| 6,201,284 B1 | 3/2001 | Hirata |

(Continued)

*Primary Examiner* — Binh X Tran
(74) *Attorney, Agent, or Firm* — Dergosits & Noah LLP

(57) ABSTRACT

A method for fabricating a tri-axial MEMS accelerometer that has a top cap silicon wafer and a bottom cap silicon wafer coupled with a measurement mass. The measurement mass has a two level structure, each level having an inner frame coupled to an outer frame by a plurality of first elastic beams, a mass coupled to the inner frame by a plurality of second elastic beams, and a comb coupling structure between the mass and the inner frame. The comb coupling structures are arranged in an orthogonal orientation. The top level and bottom level measurement masses measure acceleration in perpendicular directions. The top level and bottom level measurement masses and the inner frame form an integral unit which moves along a third direction. Acceleration in the third direction is measured from the change in capacitance between the integral unit and the top cap silicon wafer and bottom cap silicon wafer.

7 Claims, 12 Drawing Sheets

(56) References Cited

U.S. PATENT DOCUMENTS

| | | |
|---|---|---|
| 6,805,008 B2 | 10/2004 | Selvakumar et al. |
| 7,428,841 B2 | 9/2008 | Harada et al. |
| 2005/0109109 A1 | 5/2005 | Eskridge |
| 2009/0139328 A1 | 6/2009 | Inoue |
| 2010/0024554 A1 | 2/2010 | Classen |
| 2010/0109102 A1* | 5/2010 | Chen ................ G01P 15/125 257/417 |
| 2011/0290023 A1 | 12/2011 | Takagi |
| 2013/0049212 A1* | 2/2013 | Hata ............... G01C 19/5762 257/773 |
| 2013/0105921 A1* | 5/2013 | Najafi ............... G01C 19/574 257/415 |
| 2013/0152686 A1 | 6/2013 | Venkatraman |
| 2013/0277865 A1* | 10/2013 | Teh ............... H01L 23/49838 257/782 |
| 2013/0340525 A1* | 12/2013 | Liu ..................... B81B 7/02 73/514.11 |
| 2014/0165724 A1* | 6/2014 | Krylov ............. G01P 15/125 73/514.15 |
| 2014/0283601 A1* | 9/2014 | Bhave .................. G01P 3/36 73/504.12 |
| 2015/0020590 A1* | 1/2015 | Painter ................ B82Y 99/00 73/514.26 |
| 2015/0075284 A1* | 3/2015 | Che .................... B32B 38/10 73/514.32 |

* cited by examiner

TRI-AXIAL MEMS ACCELEROMETER

CROSS-REFERENCE

This application is a continuation of U.S. patent application Ser. No. 14/270,581 entitled A Tri-Axial MEMS Accelerometer, now U.S. Pat. No. 9,829,504, and claims priority from Chinese Patent Application No. 201310182168.4 entitled A Tri-Axial MEMS Accelerometer, which is incorporated herein by reference in its entirety.

TECHNICAL FIELD

This invention relates to a sensor, and in particular, to an accelerometer.

BACKGROUND

Accelerometers are used in various applications, such as measuring the magnitude of an earthquake and gathering seismic data, detecting the magnitude of a collision during a car accident, and detecting the tilting direction and angle of a mobile phone or a game console. As micro-electromechanical systems (MEMS) technology continues to progress, nano-scale accelerometers have been widely used in commercial applications.

There are two kinds of accelerometers which are commonly used: piezoresistive accelerometers and capacitive accelerometers. A piezoresistive accelerometer, such as described in Chinese Patent Application No. 200480003916.7, usually comprises a mass and beams, with piezo elements provided on the beam. The mass moves according to the acceleration and causes the beam to deform, which also causes a change of resistance. However, under situations when there is no acceleration or the acceleration magnitude is relatively small, the beam will not deform significantly, and there is no significant change in resistance. The accelerometer can only detect acceleration when the magnitude of acceleration is large enough to cause the deformation of the beam. Therefore, the piezoresistive accelerometer has low accuracy.

A capacitive accelerometer, such as described in U.S. Pat. No. 6,805,008, also includes beams and a mass. When acceleration is present, the frame of the accelerometer will move according to the acceleration direction, but due to inertia, there is little displacement for the mass. Thus, the change in gap distance between the mass and another electrode causes a change in capacitance.

Both kinds of accelerometers are manufactured by micro fabrication techniques and have the characteristics of small size and low manufacturing cost. However, the beam is an elastic beam, and there are only four beams connecting the mass with the frame. Thus, when the outer frame moves, the displacement of each beam is relatively large. Also, each beam will not create a uniform displacement and deformation, which leads to asymmetrical vibration modes. Also, this type of accelerometer only measures the acceleration by measuring the change in capacitance in the vertical direction. When there is acceleration in the vertical direction, such as a falling object, the measurement accuracy of this type of accelerometer is relatively high; but when there is only acceleration in the horizontal direction, such as side-to-side shaking, the measurement accuracy of this type of accelerometer is relatively low.

Furthermore, both types of accelerometers can only measure the acceleration in one direction. In order to measure the acceleration in three directions, three separate accelerometers are required, which not only increases the cost, but requires high installation accuracy.

SUMMARY

The present invention is intended to overcome the shortages of the existing accelerometers, and to provide an accelerometer which is capable of measuring accelerations on three axes along with high stability and high sensitivity.

The present invention provides a tri-axial MEMS accelerometer having a measurement mass, a top cap silicon wafer and a bottom cap silicon wafer, both coupled with the measurement mass. The measurement mass has a two level structure, each level including an outer frame, an inner frame located within the outer frame, and a mass coupled with the inner frame. The inner frame is coupled with the outer frame by a plurality of first elastic beams. The mass is coupled with the inner frame by a plurality of second elastic beams, wherein a comb coupling structure is provided between the mass and the inner frame. On a projection plane, the orientation of the comb coupling structure on the top level measurement mass is orthogonal to the orientation of the comb coupling structure on the bottom level of the measurement mass. The top level measurement mass and the bottom level measurement mass measure the accelerations in two perpendicular directions. The top level measurement mass, the bottom level measurement mass, and the inner frame are integrated as a whole unit which moves along a third direction. The acceleration in the third direction is measured by the change in capacitance between the whole unit and the top cap silicon wafer and bottom cap silicon wafer.

The tri-axial MEMS accelerometer in present invention also has the following additional features. The first elastic beams are provided between the inner frame and the outer frame, and the first elastic beams are symmetrically provided with respect to the midline of the mass. A plurality of the first elastic beams is provided within the gap space between the inner frame and the outer frame, and the first elastic beams can move freely within the gap space. Each first elastic beam includes two elastic beams with a Y-shape, and each Y-shape elastic beam has one main body part and two branch parts, wherein the two branch parts are coupled with the inner frame and the outer frame, respectively.

The end portions of the main body part of the two Y-shape elastic beams are provided at the corner of the inner frame, and the two end portions are connected to each other at a right angle. A gap space is formed between the mass and the inner frame. The mass is coupled with the inner frame by a plurality of second elastic beams, and the second elastic beams are each provided at the corners of the mass, and coupled with the inner frame.

Two sets of the comb coupling structures are oppositely formed in the gap space between the mass and the inner frame and the comb coupling structure can move freely within the gap space.

The measurement mass has a silicon on insulator ("SOI") structure, which includes a top silicon layer and a bottom silicon layer with a buried oxide layer provided between the two silicon layers, and an epilayer is formed on the surface of the top silicon layer. The first elastic beams are formed in the epilayer, the second elastic beams are formed in the epilayer, the top silicon layer, and the buried oxide layer, and a gap space is formed between the two masses.

A first electrode is coupled with the measurement mass, a second electrode is coupled with the top cap silicon wafer, and a third electrode is coupled with the bottom silicon wafer.

A fabrication technique for tri-axial MEMS accelerometer includes the following steps:

(i) growing the epilayer on the top silicon layer of the silicon on insulator (SOI) silicon wafer;

(ii) growing by use of thermal oxidation or chemical deposition, a silicon dioxide layer on the surfaces of the top silicon layer and the bottom silicon layer;

(iii) removing, by use of photolithography and etching, a portion of the silicon dioxide layer, which is on the surface of the bottom silicon layer, and exposing a portion of the bottom silicon layer;

(iv) forming, by depositing silicon nitride on the surface of the silicon dioxide layer, a silicon nitride layer;

(v) removing, by use of photolithography and etching, the outer portion of the silicon nitride layer and the silicon dioxide layer, which are on the surface of the bottom silicon layer, and exposing a portion of the bottom silicon layer; then removing, by use of photolithography and etching, the inner portion of the silicon nitride layer, which is on the surface of the bottom silicon layer, and exposing the silicon dioxide layer;

(vi) etching the exposed outer portion of the bottom silicon layer to a certain depth to form the outer frame;

(vii) removing, by use of etching, the exposed inner portion of the silicon dioxide layer, and exposing the bottom silicon layer;

(viii) further etching the exposed portion of the bottom silicon layer until exposing the buried oxide layer at the outer portion of the bottom silicon layer, thus forming the outer frame and the inner frame;

(ix) removing, by use of etching, the buried oxide layer at the outer portion of the bottom silicon layer; and further etching the exposed portion of the bottom silicon layer, until exposing the buried oxide layer at the inner portion of the bottom silicon layer, thus forming the second elastic beams;

(x) removing the silicon nitride layer on the surface of the bottom silicon layer, etching the outer portion of the bottom silicon layer to the epilayer, thus forming the first elastic beams; at the same time, etching the center portion of the bottom silicon layer, where the mass is located, to a certain thickness, thus forming the gap space between two layers of the masses;

(xi) removing the silicon dioxide layer on the surface of the bottom silicon layer, and bonding together, by a back-to-back silicon bonding, two etched silicon on insulator silicon wafers;

(xii) forming, by use of photolithography and deep etching, a plurality of holes, with depth from silicon nitride layer to the epilayer, on the surface of top silicon layer, then further forming, by performing deep etching to the holes, a plurality of through holes, thus forming the freely moveable first and second elastic beams;

(xiii) removing the silicon nitride layer and the silicon dioxide layer on the surfaces of the bonded wafer structure, and forming the measurement mass;

(xiv) bonding the top cap silicon wafer, the measurement mass, and the bottom cap silicon wafer.

The fabrication technique for the top cap silicon wafer and bottom cap silicon wafer further comprises:

A. forming, by use photolithography, deep etching and etching, a plurality of through holes on the top cap silicon wafer or the bottom cap silicon wafer;

B. forming, by use photolithography, deep etching and etching, a recess area on each bonding surface of the top cap silicon wafer and the bottom cap silicon wafer;

C. before the bonding step, cleaning the top cap silicon wafer and the bottom cap silicon wafer;

D. after the bonding step, depositing metal on the surfaces of the top cap silicon wafer and the bottom cap silicon wafer to form electrodes; and depositing metal on the surface of the silicon on insulator silicon wafer through the through holes formed on the top cap silicon wafer or the bottom cap silicon wafer, to form electrodes from the through holes.

The deep etching or etching method is selected from one or more following methods: dry etching or wet etching; and the dry etching comprises silicon deep reactive ion etching or reactive ion etching.

The etchant for etching the silicon layer comprises one or more of the following etchants: potassium hydroxide, tetramethylammonium hydroxide, ethylenediamine pyrocatechol or gaseous xenon difluoride.

The etchant for etching the silicon dioxide layer comprises one or more of the following etchants: buffered hydrofluoric acid, 49% hydrofluoric acid by weight, or gaseous hydrogen fluoride.

A tri-axial MEMS accelerometer formed according to this disclosure has high sensitivity and the following advantages. The accelerometer is capable of measuring acceleration in the horizontal directions, which is achieved by measuring the capacitance between the mass and the inner frame; providing the comb coupling structures between the mass and the inner frame makes the measurement more accurate. Additionally, the mass in the present accelerometer is relatively large and uses a plate capacitor measurement method, which provides high sensitivity. Furthermore, the accelerometer divides acceleration into three directions (X, Y, Z), and uses an individual capacitor to measure the acceleration in each direction. Thus, the measurement sensitivity is increased, and the interference between each measurement direction is reduced. The accelerometer also has a fully symmetrical design, which further decreases the interference between measurements in each measurement direction, increases the mode isolation ratio of the accelerometer, and reduces the noise of the MEMS chip. The design integrates multiple masses in the vertical direction by bonding, and further reduces the overall size of the accelerometer. Since the etching technique and the bonding technique are relatively simple, the present fabrication technique also has high productive efficiency and low manufacturing cost.

DETAILED DESCRIPTION

The present invention will be described in further detail below with reference to the drawings and specific embodiments.

Figure 1:
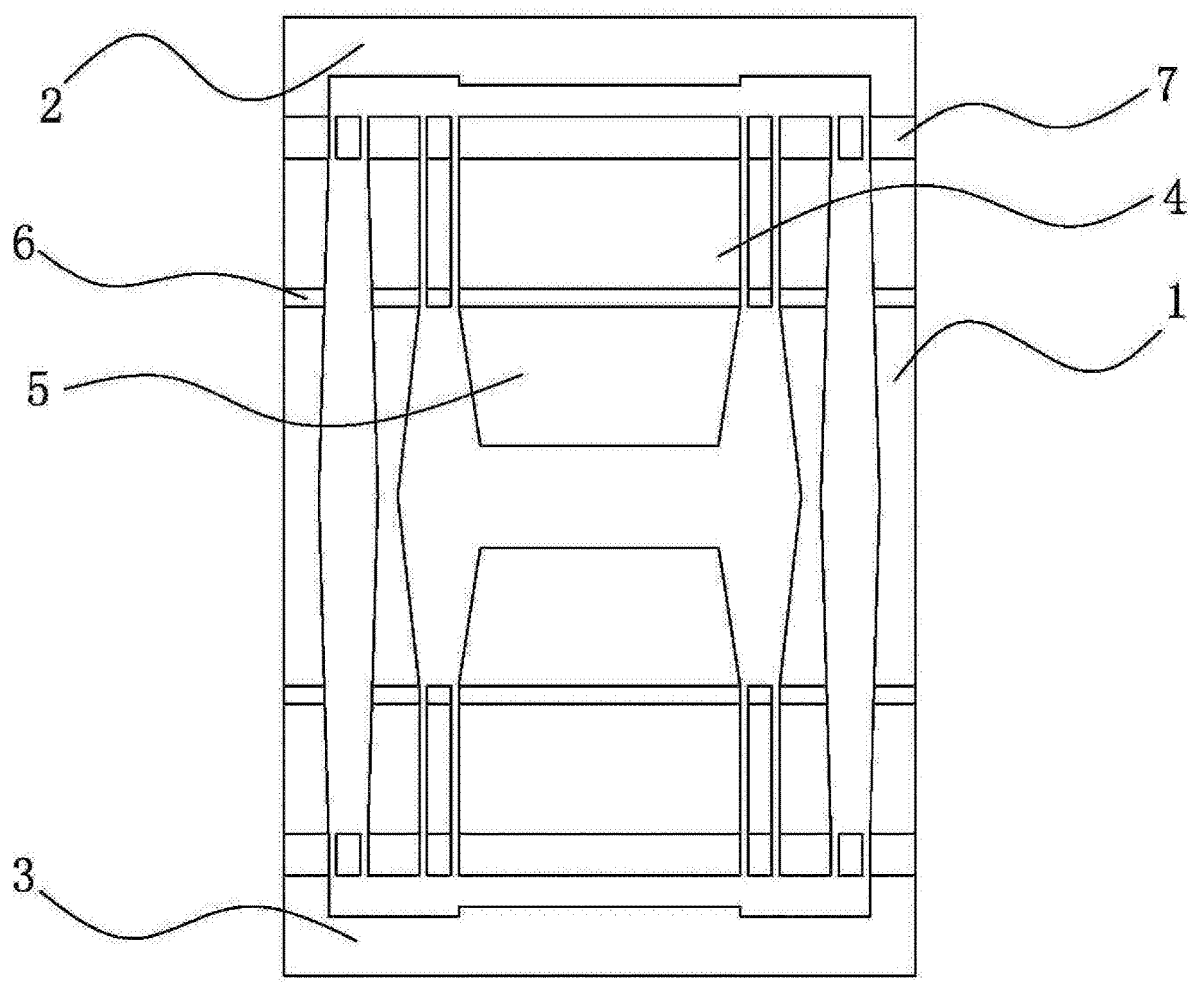
FIG. 1 is a plan view of an accelerometer structure.

FIG. 1 shows a tri-axial MEMS accelerometer with high sensitivity, including a measurement mass 1 having a top cap silicon wafer 2 and a bottom cap silicon wafer 3 coupled with the measurement mass 1. Electrodes are provided on the measurement mass 1, the top cap silicon wafer 2 and the bottom cap silicon wafer 3.

The measurement mass 1 has a "silicon-on-insulator" ("SOI") structure which includes a top silicon layer 4, a bottom silicon layer 5, and a buried oxide layer 6 provided between the top and bottom silicon layers, with an epilayer 7 formed on the surface of the top silicon layer.

Figure 2:
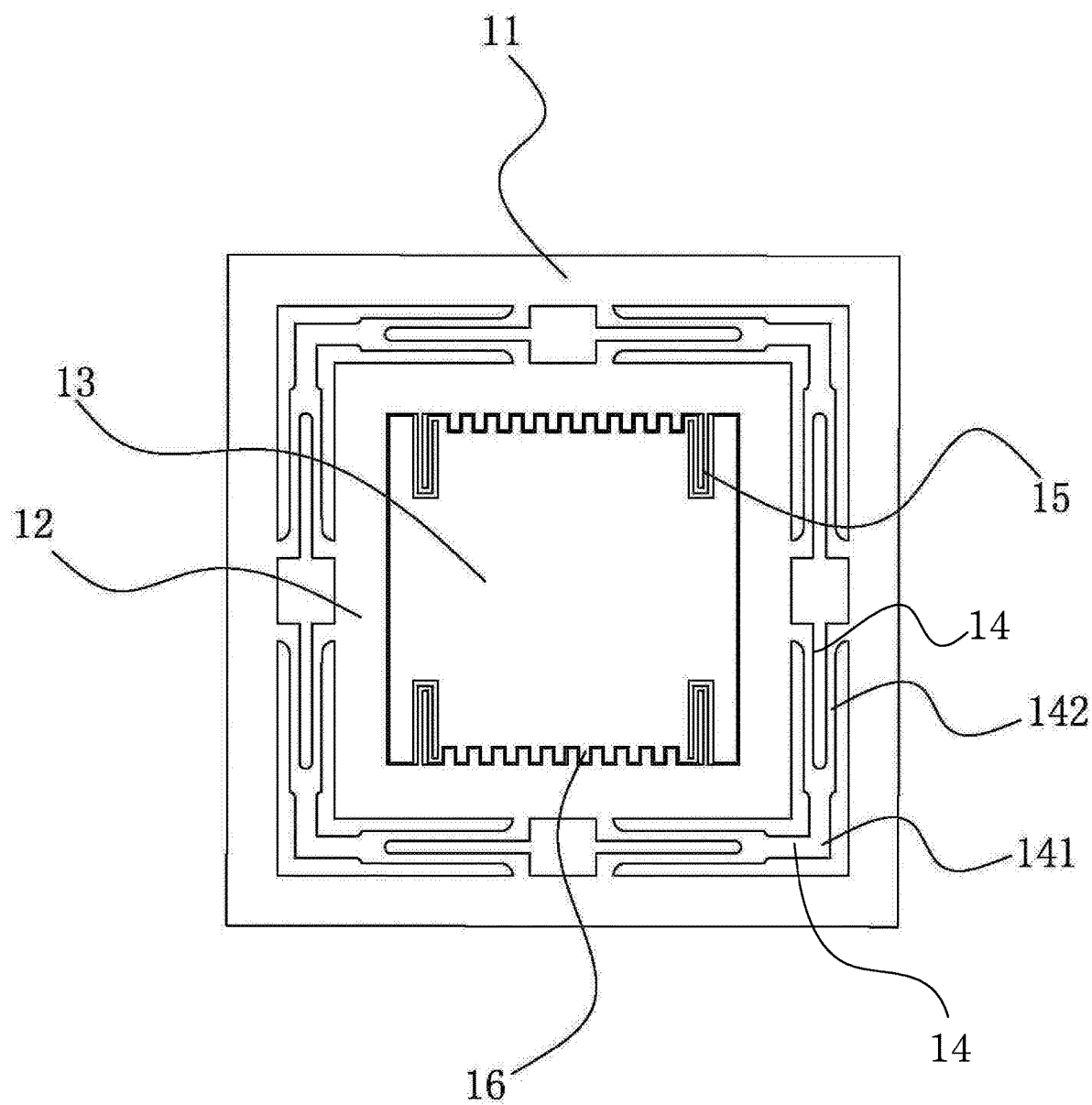
FIG. 2 is a top view of the measurement mass of the structure of FIG. 1.

FIG. 2 shows the measurement mass 1, including an outer frame 11, an inner frame 12 located within the outer frame, and a mass 13. The inner frame 12 is coupled with the outer frame 11 by first elastic beams 14. Multiple groups of first elastic beams 14 are provided in the gap space between the outer frame 11 and the inner frame 12, and the first elastic beams 14 can move freely within the gap space. Each group of the first elastic beams 14 comprises two elastic beams with a Y shape. Each Y-shape elastic beam includes a main body part 141 and two branch parts 142, with the two branch parts 141, 142 respectively coupled with the outer frame 11 and the inner frame 12. Each group of the first elastic beams 14 is symmetrically provided with respect to the midline of the mass 13. The main body parts 141 of the two Y-shape elastic beams are provided at the corner of the inner frame 12, and are connected at a right angle.

Figure 3:
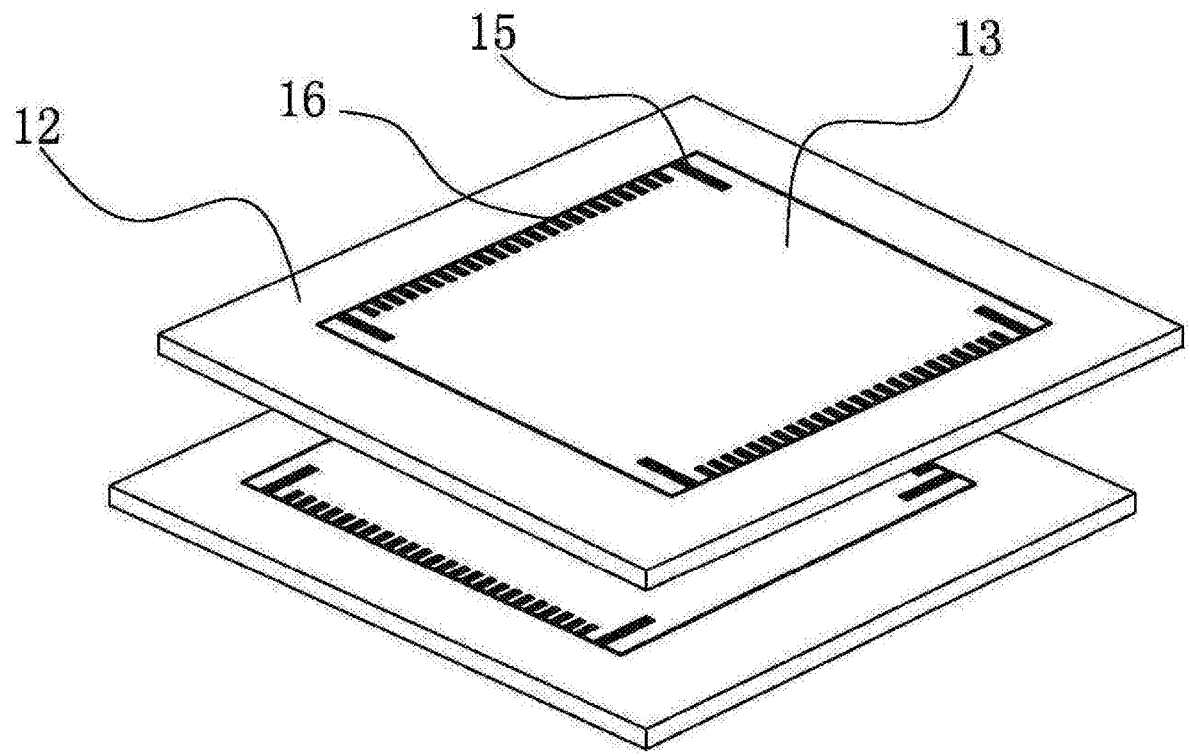
FIG. 3 is a perspective view of the two level mass of the structure of FIG. 1.
Figure 4:
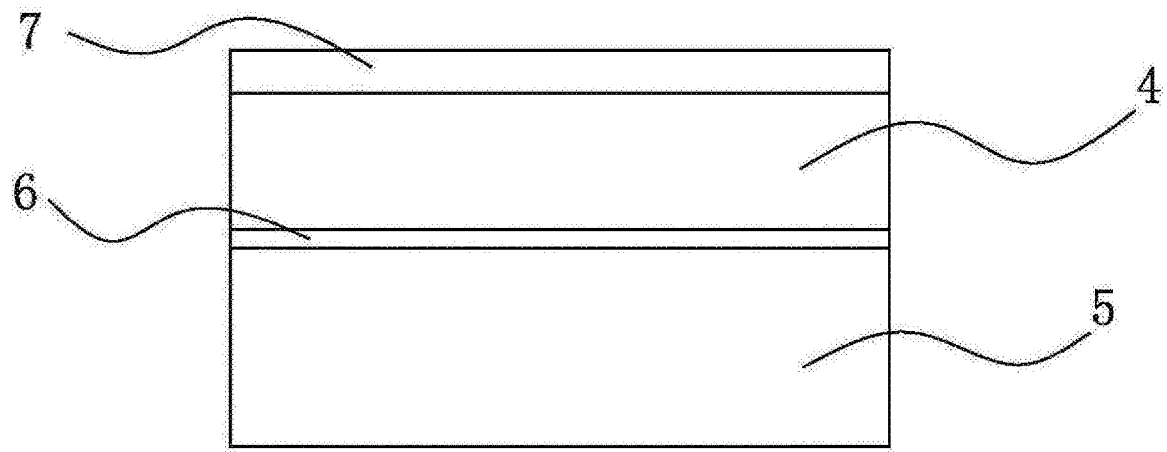
FIG. 4 illustrates step 1 of a fabrication technique for the structure of FIG. 1.
Figure 5:
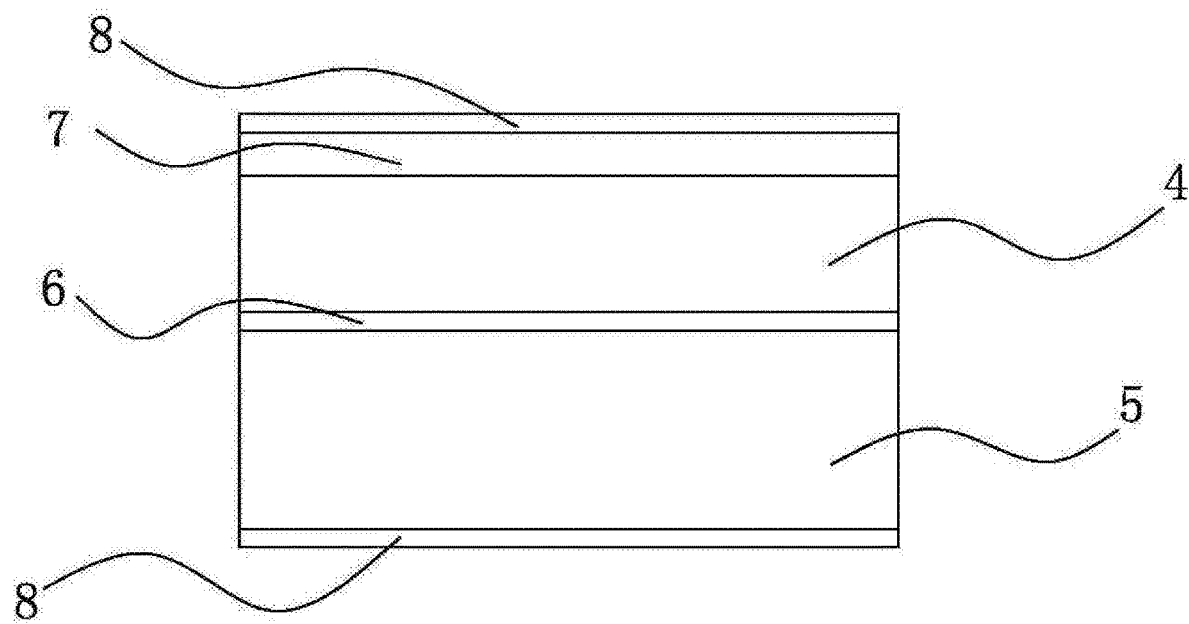
FIG. 5 illustrates step 2 of a fabrication technique for the structure of FIG. 1.
Figure 6:
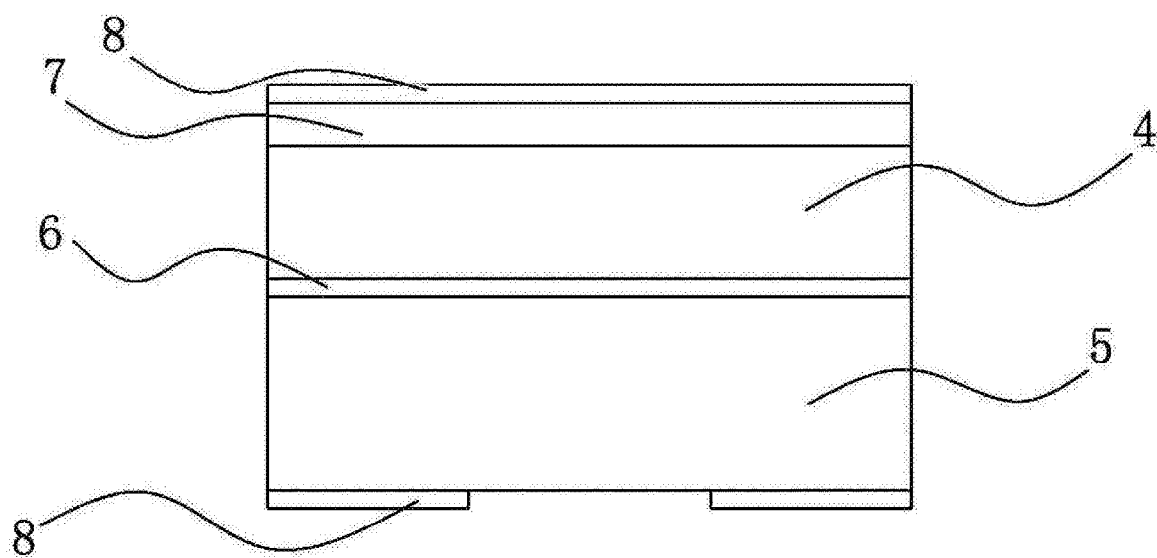
FIG. 6 illustrates step 3 of a fabrication technique for the structure of FIG. 1.
Figure 7:
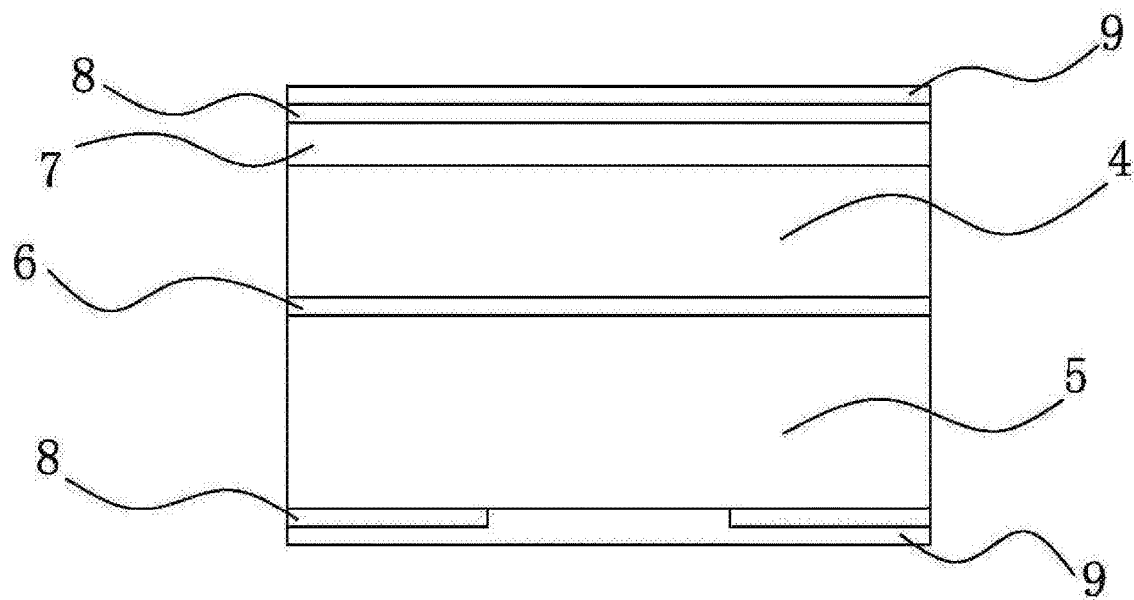
FIG. 7 illustrates step 4 of a fabrication technique for the structure of FIG. 1.
Figure 8:
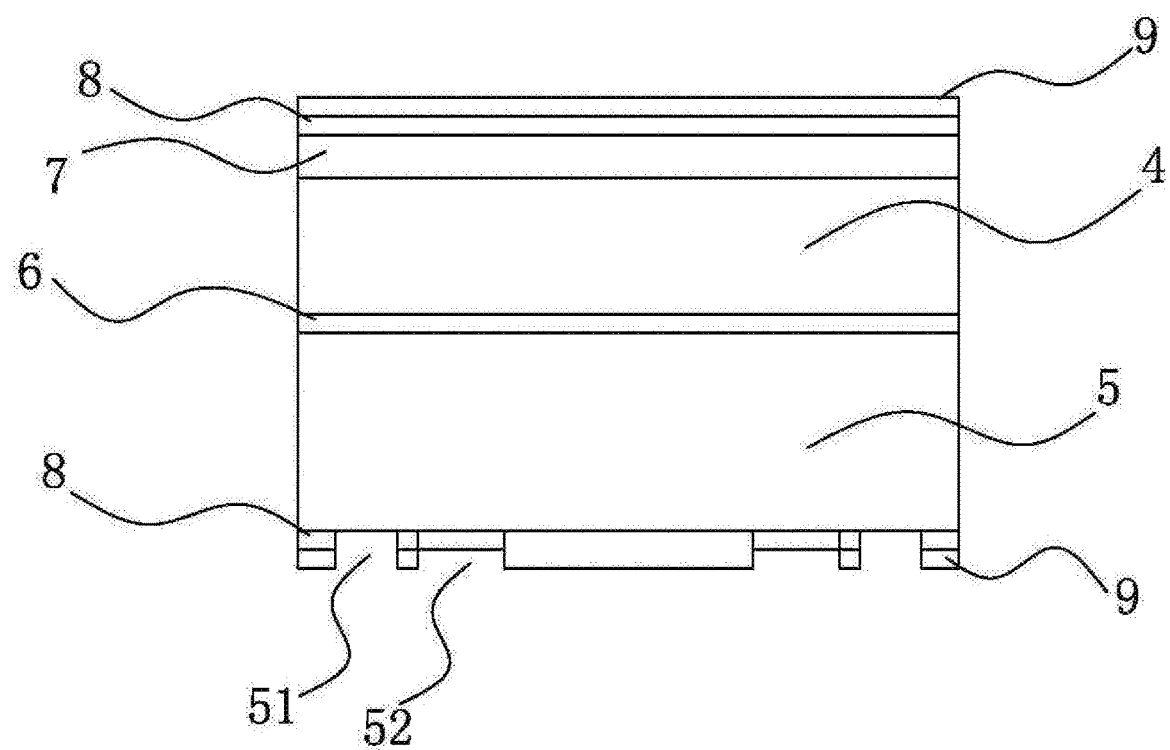
FIG. 8 illustrates step 5 of a fabrication technique for the structure of FIG. 1.
Figure 9:
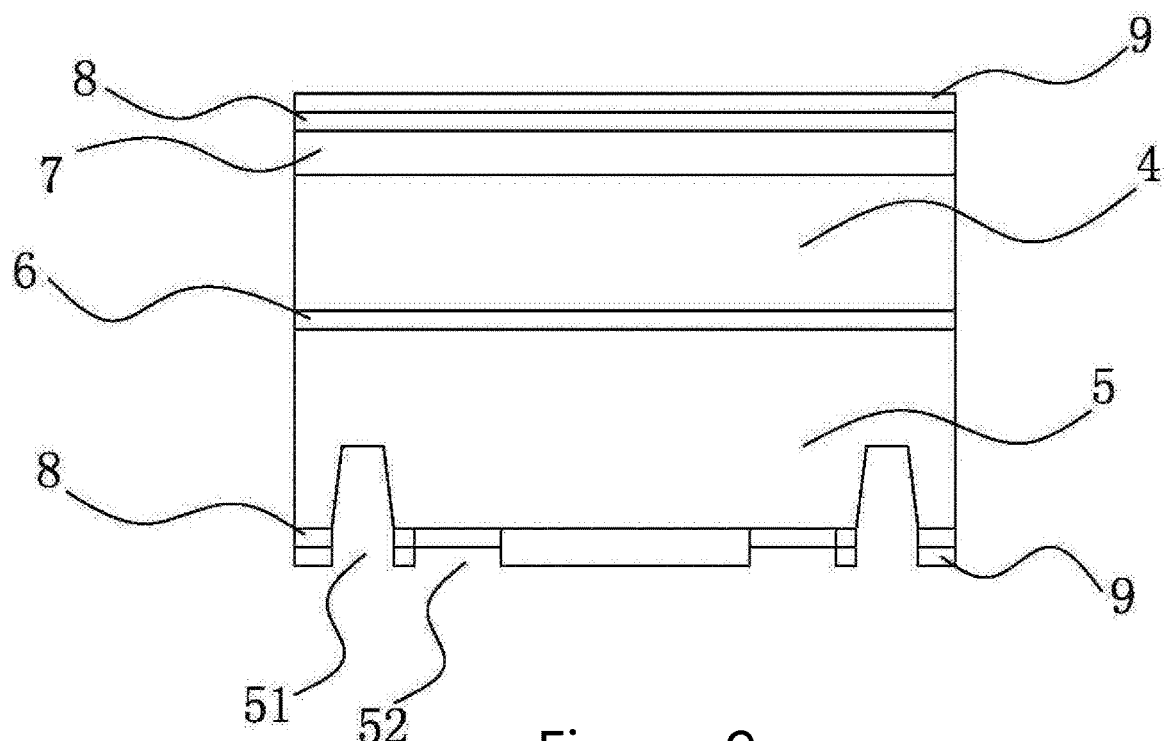
FIG. 9 illustrates step 6 of a fabrication technique for the structure of FIG. 1.
Figure 10:
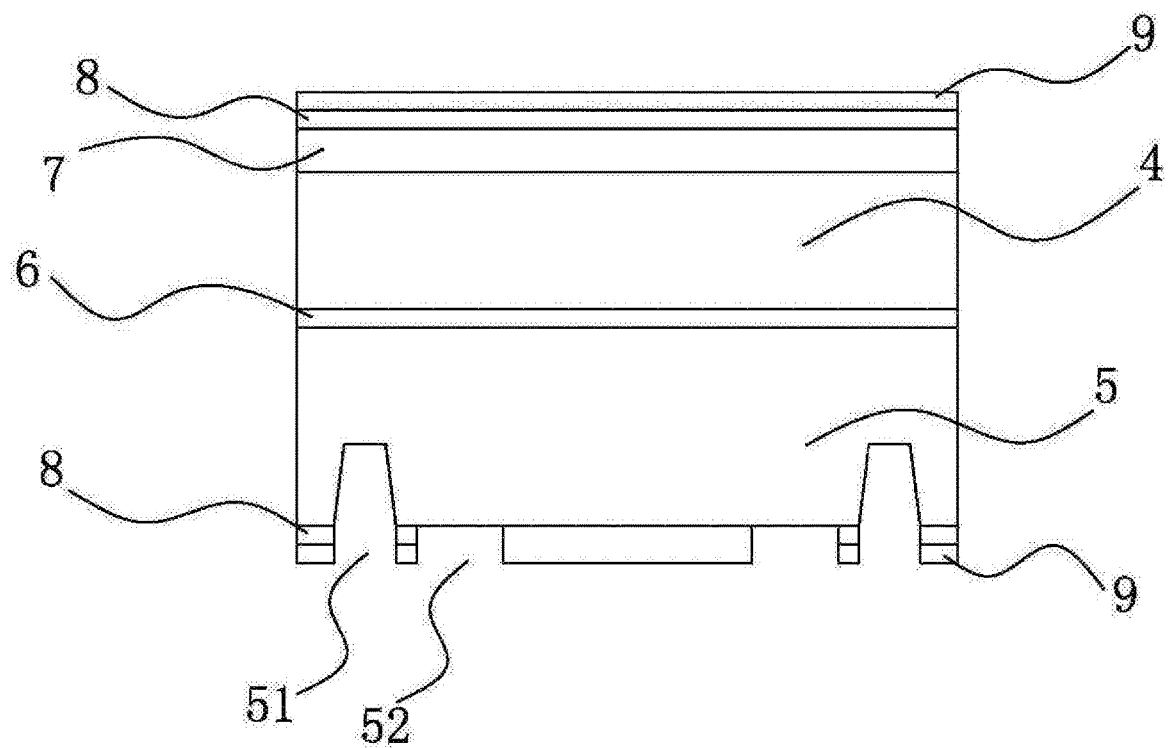
FIG. 10 illustrates step 7 of a fabrication technique for the structure of FIG. 1.
Figure 11:
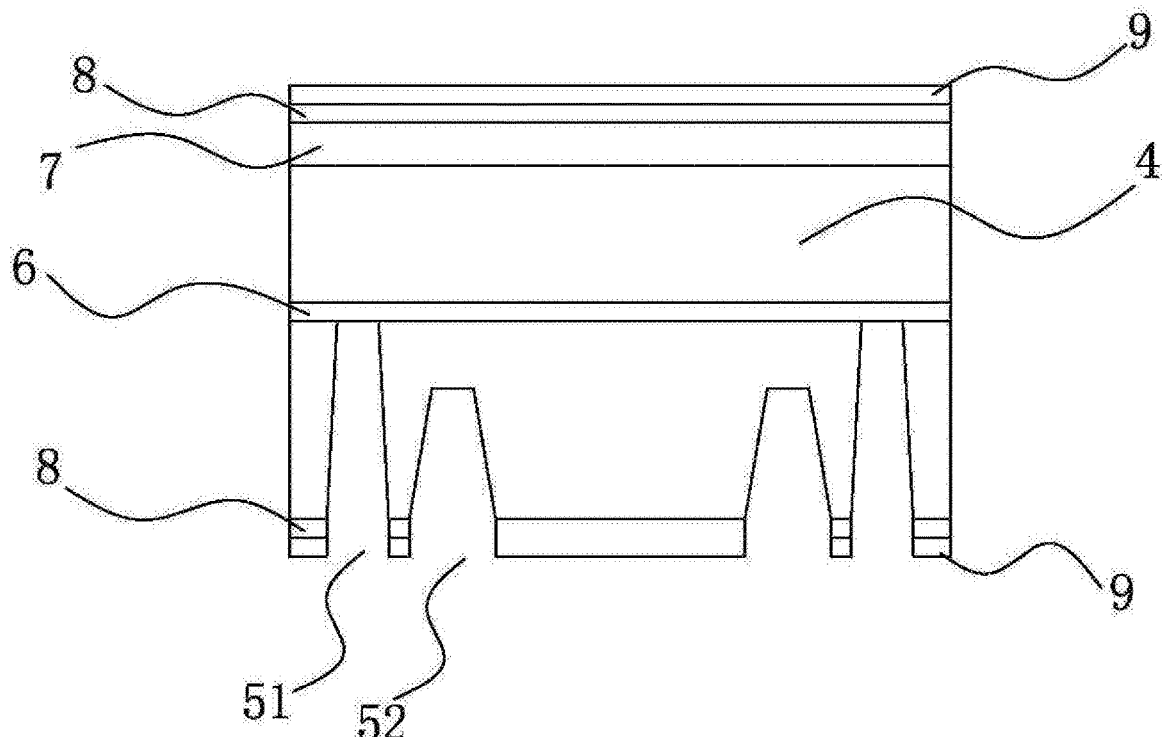
FIG. 11 illustrates step 8 of a fabrication technique for the structure of FIG. 1.
Figure 12:
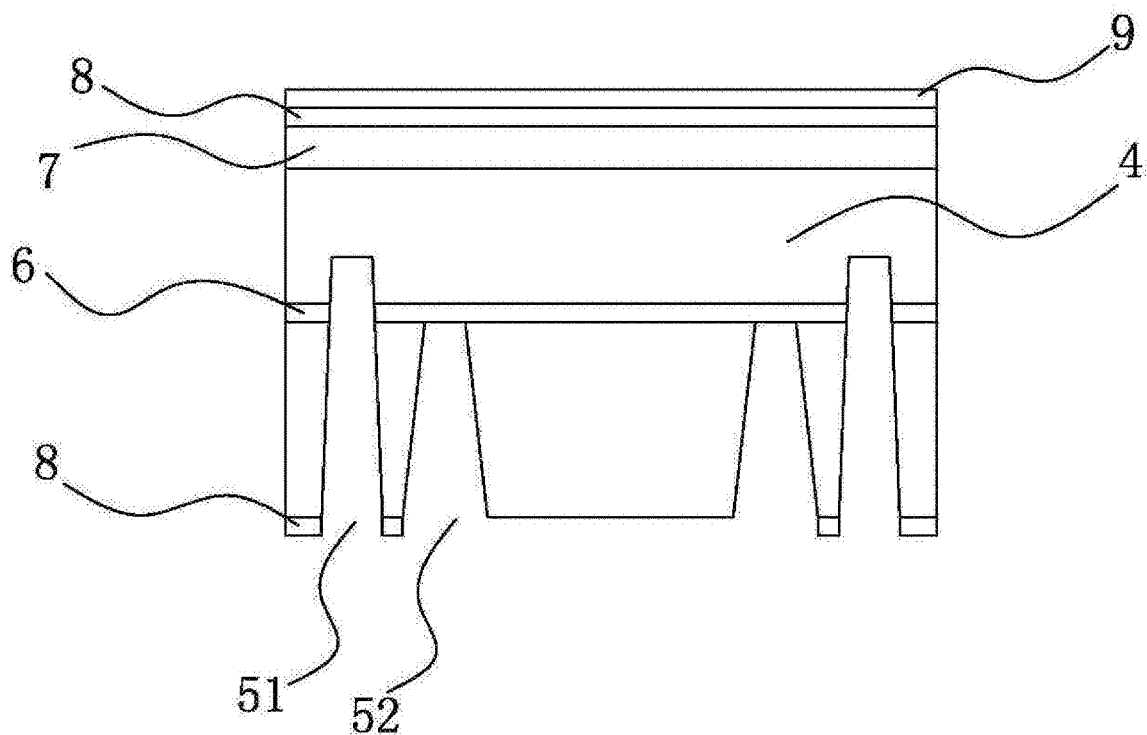
FIG. 12 illustrates step 9 of a fabrication technique for the structure of FIG. 1.
Figure 13:
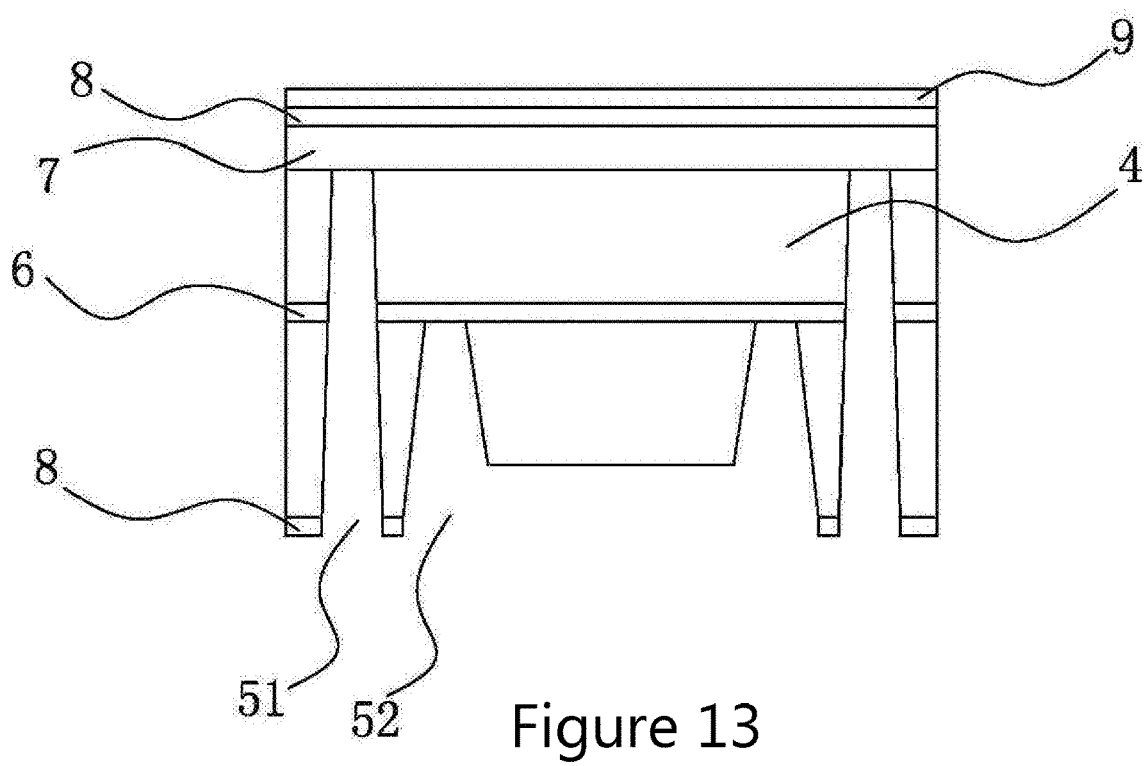
FIG. 13 illustrates step 10 of a fabrication technique for the structure of FIG. 1.
Figure 14:
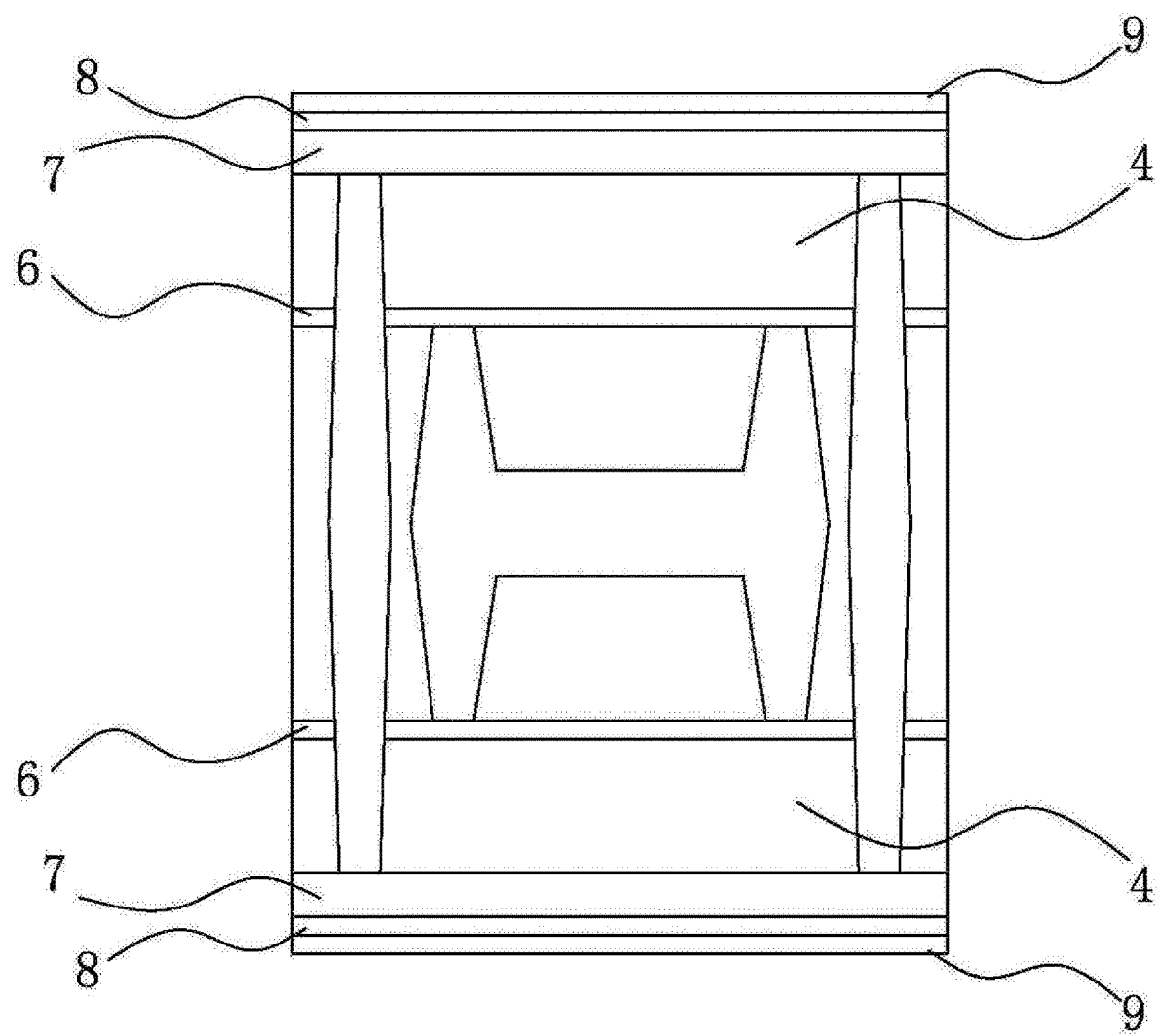
FIG. 14 illustrates step 11 of a fabrication technique for the structure of FIG. 1.
Figure 15:
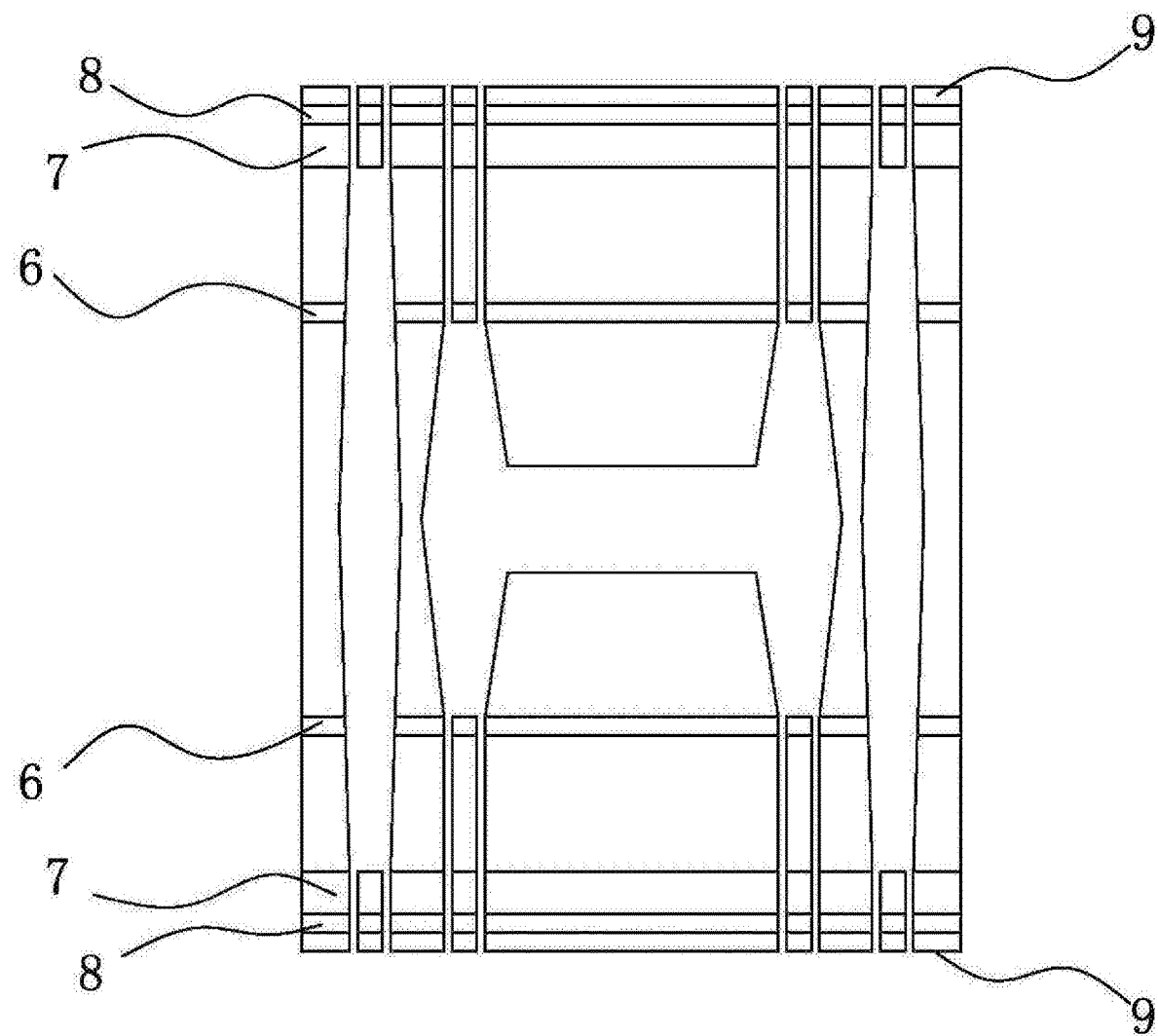
FIG. 15 illustrates step 12 of a fabrication technique for the structure of FIG. 1.
Figure 16:
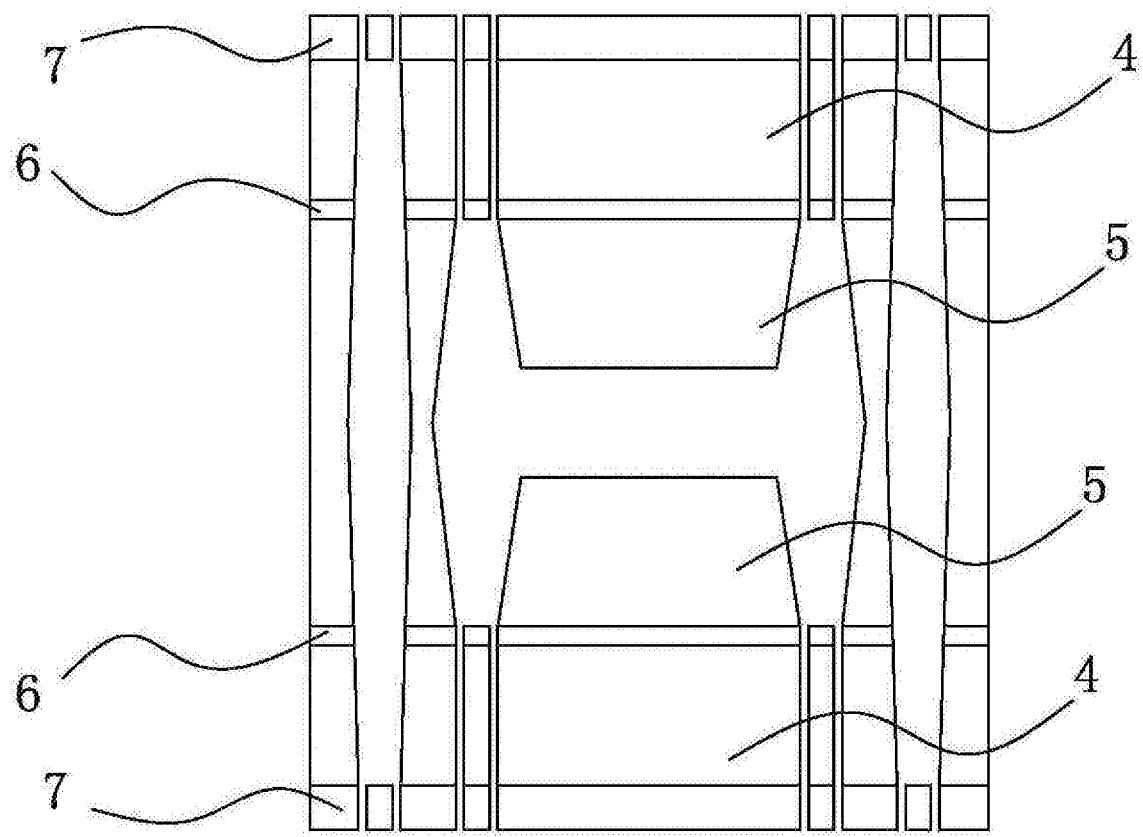
FIG. 16 illustrates step 13 of a fabrication technique for the structure of FIG. 1.
Figure 17:
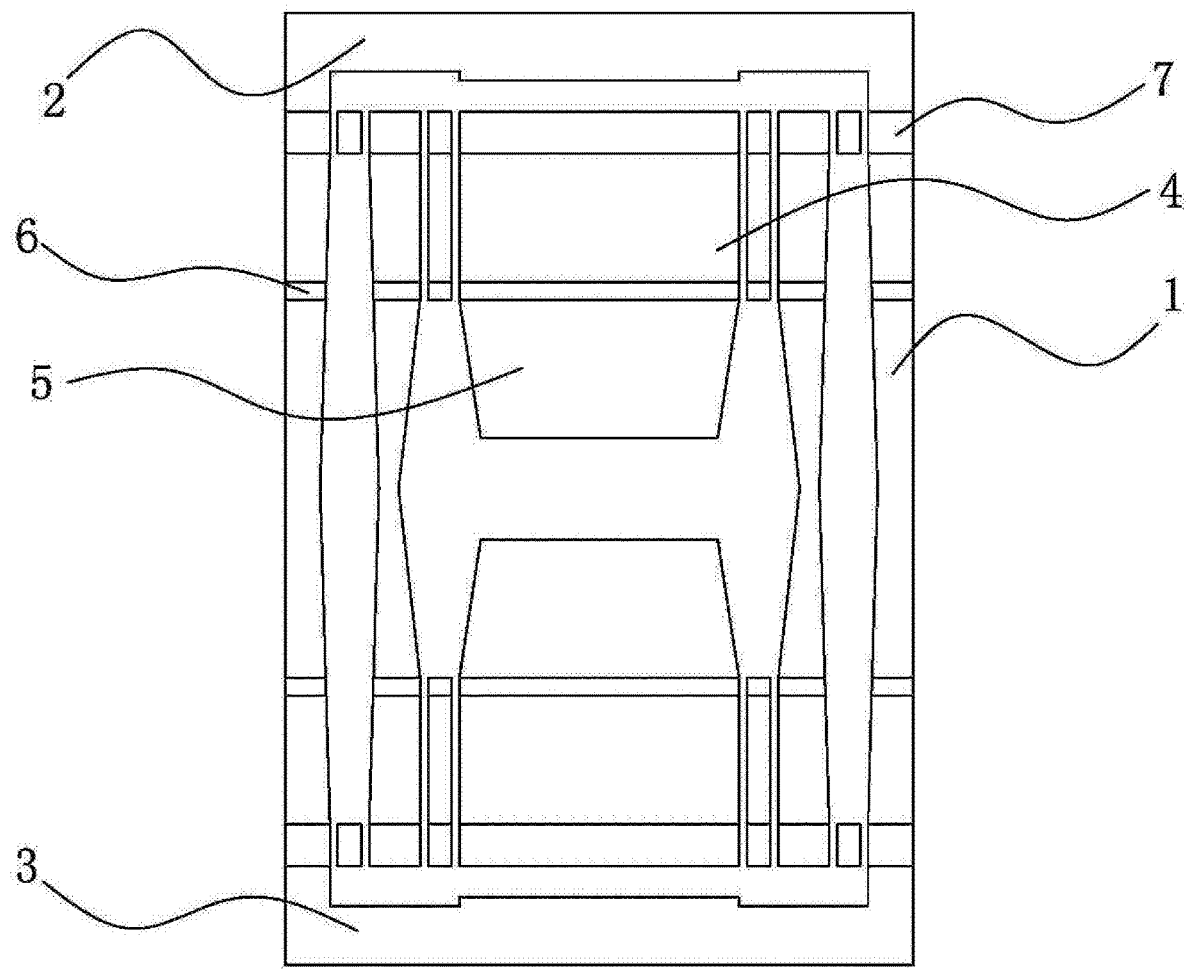
FIG. 17 illustrates step 14 of a fabrication technique for the structure of FIG. 1.

With reference to FIGS. 1-3, the mass 13 is coupled with the inner frame 12 by second elastic beams 15. The second elastic beams 15 are elastic folded beams. Preferably, the mass 13 is a rectangular body, and second elastic beams 15 are respectively provided at the four corners of the mass 13. Multiple groups of comb coupling structures 16, which correspond to each other, are respectively provided along two sides of inner frame 12 and the mass 13.

The measurement mass 1 in the present invention has a two level structure, each level having its individual outer frame 11, inner frame 12 and mass 13. In each level, a gap space is provided in the horizontal direction between the inner frame 12 and the mass 13. On a projection plane, the orientation of the comb coupling structure 16 on the top level measurement mass is orthogonal to the orientation of the comb coupling structure 16 on the bottom level of the measurement mass. The top level measurement mass and the bottom level measurement mass measure the acceleration in two perpendicular directions. For example, the top level measurement mass measures the acceleration in the X direction and the bottom level measurement mass measures the acceleration in the Y direction. With respect to the third direction, the top level measurement mass, the bottom level measurement mass, and the inner frame 12 are integrated as a whole unit, and the acceleration in the third direction is measured through the change in capacitance between the whole unit and the top cap silicon wafer and the bottom cap silicon wafer. The third direction refers to the Z direction. In the present invention, the term "tri-axial" refers to the X, Y, and Z directions in three dimensional space.

With reference to FIGS. 1-3, after the accelerometer is packaged into chips, a capacitance is formed between the measurement mass 1, the top cap silicon wafer 2, and the bottom cap silicon wafer 3. In each level of the measurement mass, a capacitance is also formed between the comb coupling structure 16 provided between the inner frame 12 and the mass 13. According to equation $C=\varepsilon A/d$, the capacitance between two parallel conductive plates is equal to the permittivity ($\varepsilon$) of material times the area (A) divided by the separation distance (d). When displacement is generated due to acceleration in the vertical direction, the separation distance between inner frame 12, the mass 13, the top cap silicon wafer 2 and the bottom cap silicon wafer 3 changes. Therefore, the capacitance between the measurement mass 1, the top cap silicon wafer 2 and the bottom cap silicon wafer 3 also changes. The integrated circuit can calculate the measured vertical acceleration based on the change of capacitance. After the acceleration disappears, the first elastic beams 14 will return to their original state, which returns the capacitance between the inner frame 12, the mass 13, the top cap silicon wafer 2 and the bottom cap silicon wafer 3 to a constant value. While measuring the acceleration in the horizontal direction, with respect to the inner frame 12, the mass 13 will displace towards the acceleration direction. The capacitance on the comb coupling structure 16, which is provided between the inner frame 12 and the mass 13, will also change. The integrated circuit can calculate the measured vertical acceleration based on the change of capacitance. After the acceleration disappears, the second elastic beams 15 will return to their original state, which returns the capacitance between the inner frame 12 and the mass 13 to a constant value. Furthermore, the comb coupling structure 16 between the inner frame 12 and the mass 13 provided on the top level and the bottom level has a different orientation. There is also a gap space provided between the two levels. This design breaks the horizontal acceleration into acceleration in the X direction and acceleration in the Y direction. The inner frame 12 and the mass 13 on each level only need to measure the magnitude of acceleration in one direction. For the vertical direction, which is the Z direction, the acceleration is measured by the change in capacitance between the inner frame 12, the mass 13, the top cap silicon wafer 2 and the bottom cap silicon wafer 3. Thus, the present accelerometer breaks the acceleration into X, Y, Z directions, and measures the accelerations in the three directions, so that the measurement accuracy has increased. Further, separating the two levels of inner frames 12 and masses 13 reduces the interference and noise between each level. Furthermore, the second elastic beams 15 are relatively thick, and their stiffness in the vertical direction is relatively large. Thus, when there is a vertical acceleration, the vertical displacement of the mass 13 is relatively small with respect to the inner frame. Similarly, the first elastic beams 14 are relatively wide, and their stiffness in the horizontal direction is relatively large. When there is a horizontal acceleration, the horizontal displacement between the outer frame 11 and the inner frame 12 is relatively small. The elastic beam design further decreases the interference between the X, Y, Z directions while measuring the different components of acceleration.

The fabrication technique for an embodiment of the accelerometer is described with reference to FIGS. 4-17.

In Step 1 (FIG. 4), the epilayer 7 is grown on the surface of the top silicon layer 4 of the SOI silicon wafer, for example, by thermal chemical deposition.

In Step 2 (FIG. 5), a layer of silicon dioxide 8 is formed on the surfaces of the top silicon layer 4 and the bottom silicon layer 5 of the SOI silicon wafer, for example, by thermal oxidation, or by chemical vapor deposition (CVD) method.

In Step 3 (FIG. 6), a layer of photoresist is coated on the bottom silicon layer 5 of the SOI silicon wafer, then exposed according to certain patterns, and developed to reveal the patterns. The exposed portion of the silicon dioxide layer 8 is etched by using dry reactive ion etching or buffered hydrofluoric acid until the center portion of the bottom silicon layer 5 is exposed.

In Step 4 (FIG. 7), a layer of silicon nitride 9 is deposited on the surfaces of top silicon layer 4 and bottom silicon layer 5, for example, using the CVD method.

In Step 5 (FIG. 8), a layer of photoresist is coated on the bottom silicon layer 5, then exposed according to certain patterns, and developed to reveal the patterns. The exposed portion is etched at the outer portion 51 of the bottom silicon layer 5, the silicon dioxide layer 8 and silicon nitride layer 9, until the outer portion of the bottom silicon layer is exposed. The silicon nitride layer 9 is etched at the inner portion of the bottom silicon layer 52 until the silicon dioxide layer is exposed, for example, using dry reactive ion etching.

In Step 6 (FIG. 9), the outer portion 51 of the bottom silicon layer is etched to a certain depth, for example, using potassium hydroxide, or tetramethylammonium hydroxide, or ethylenediamine pyrocatechol.

In Step 7 (FIG. 10), for example, using buffered hydrofluoric acid, 49% hydrofluoric acid by weight, or gaseous hydrogen fluoride, the silicon dioxide layer 8 is etched at the inner portion of the bottom silicon layer 52 until the bottom silicon layer 5 is exposed.

In Step 8 (FIG. 11), for example, using potassium hydroxide, or tetramethylammonium hydroxide, or ethylenediamine pyrocatechol, the outer portion 51 and the inner portion 52 of the bottom silicon layer 5 are spontaneously etched until the buried oxide layer 6 at the outer portion of the bottom silicon layer is exposed, which forms the outer frame 11 and inner frame 12.

In Step 9 (FIG. 12), the buried oxide layer 6 is removed, for example, using buffered hydrofluoric acid, 49% hydrofluoric acid by weight, or gaseous hydrogen fluoride. The outer portion 51 and the inner portion 52 of the bottom silicon layer 5 are then spontaneously etched, for example, by using potassium hydroxide, or tetramethylammonium hydroxide, or ethylenediamine pyrocatechol. The silicon nitride layer 9 on the surface of the bottom silicon layer 5 is removed, for example, by using dry reactive ion etching method, thus forming the second elastic beams 15.

In Step 10 (FIG. 13), for example, by using potassium hydroxide, or tetramethylammonium hydroxide, or ethylenediamine pyrocatechol, the outer portion 51 of the bottom silicon layer 5 is etched until the epilayer 7 is exposed, thus forming the first elastic beams 14. At the same time, a certain thickness of the center portion of the bottom silicon layer 5 is etched away where the mass 13 is located in order to form the gap space between two levels of masses 13.

In Step 11 (FIG. 14), the silicon dioxide layer 8 on the surface of bottom silicon layer 5 is removed, for example, by using buffered hydrofluoric acid, 49% hydrofluoric acid by weight, or gaseous hydrogen fluoride, and the silicon wafer surface is cleaned. A back-to-back silicon-silicon bonding is performed with two SOI silicon wafers, which have been etched and cleaned. The outer frames 11 and inner frames 12 of the two level measurement mass 1 are coupled with each other, and a gap space is provided between two levels of masses 13.

In Step 12 (FIG. 15), a layer of photoresist is coated on the surface of the top silicon layer 4 of the bonded SOT wafer, then exposed according to certain patterns, and developed to reveal the patterns. The silicon nitride layer 9 and the silicon dioxide layer 8 are etched on the top and bottom surfaces of the bonded silicon wafer structure to form a plurality of holes, which are deep to the epilayer 7. The holes are deep etched again to form through holes, thus forming the first elastic beams 14 and the second elastic beams 15, which can move freely.

In Step 13 (FIG. 16), for example, by using buffered hydrofluoric acid, or 49% hydrofluoric acid by weight, the silicon nitride layer 9 and the silicon dioxide layer 8 are removed from the top and bottom surfaces of the bonded silicon wafer structure, thus forming the completed measurement mass 1.

In Step 14 (FIG. 17), a one-step bonding is performed with the completed measurement mass 1, the top cap silicon wafer 2, and the bottom cap silicon wafer 3.

The fabrication technique for an embodiment of the accelerometer further includes the following steps for the top cap silicon wafer and bottom cap silicon wafer.

Step A. Before bonding with the SOT silicon wafer, the surface of the top cap silicon wafer 2 or the bottom cap silicon wafer 3 is coated with photoresist, then exposed according to certain patterns, and developed to reveal the patterns. The exposed portion of the top cap silicon wafer 2 or bottom cap silicon wafer 3 is then deep etched to form multiple through holes, for example, by using deep reactive ion etching method, potassium hydroxide, tetramethyl ammonium hydroxide, or ethylenediamine pyrocatechol. The photoresist is removed afterward.

Step B. The top cap silicon wafer 2 and the bottom cap silicon wafer 3 are coated with photoresist; then exposed according to certain patterns, and developed to reveal the patterns. The exposed portions of the top cap silicon wafer 2 and the bottom cap silicon wafer 3 are respectively deep etched to a certain depth, for example, by using deep reactive ion etching method, potassium hydroxide, tetramethylammonium hydroxide, or ethylenediamine pyrocatechol, to thereby form a recess area respectively on each bonding surface of the top cap silicon wafer 2 and the bottom cap silicon wafer 3.

Step C. The top cap silicon wafer 2 and the bottom cap silicon wafer 3 are cleaned before bonding with the SOT silicon wafer.

Step D. After bonding with the SOT silicon wafer, metal is deposited on the surfaces of the top cap silicon wafer 2 and bottom cap silicon wafer 3 to form electrodes, and metal is deposited on the surface of the SOI silicon wafer through the through hole formed on either the top cap silicon wafer or bottom cap silicon wafer to form an electrodes through the through holes.

The silicon dioxide layers 8 and silicon nitride layers 9 described in the above fabrication technique serve the purpose of protecting the covered up silicon layers from etching or corrosion. The epilayer 7 is a monocrystalline silicon layer with relatively high dopant concentration, and serves the purpose of preventing the silicon layer from being further etched by the potassium hydroxide, tetramethylammonium hydroxide, or ethylenediamine pyrocatechol.

The method for etching or deep etching is performed using dry etching or wet etching, and the dry etching method includes silicon deep reactive ion etching and reactive ion etching.

The material, equipment, and techniques used described herein are generally known, but the accelerometer is dramatically improved by using these materials and techniques, particularly by using the SOI silicon wafer. The first elastic beams 14, the second elastic beams 15 and the mass 13, formed by etching the SOI silicon wafer, are highly symmetrical. Since the etching technique process is relatively simple, the present fabrication technique process also has high production efficiency and low manufacturing cost. Furthermore, the geometry and vibration modes of the present accelerometer are fully symmetrical, which further increases the measurement accuracy. The corresponding comb coupling structures 16, provided between the inner frame 12 and the mass 13, further increase the measurement accuracy of the present accelerometer. By providing two levels of mass 13 with two different orientations of the comb coupling structures 16, the measurement accuracy is further increased by dividing the acceleration into three directions (X, Y, Z) and performing individual measurements.

The invention claimed is:

1. A fabrication technique for a tri-axial MEMS accelerometer, the accelerometer including a top level measurement structure having a top cap silicon wafer and a bottom level measurement structure having a bottom cap silicon wafer, each measurement structure including an outer frame, an inner frame enclosed within the outer frame, a mass coupled with the inner frame, and a comb electrode structure between the mass and the inner frame, wherein the comb electrode structure on the top level measurement structure is oriented orthogonally to the corresponding comb electrode structure on the bottom level measurement structure, and wherein for each measurement structure the inner frame is coupled with the outer frame by a plurality of first elastic beams, and the inner frame is coupled to the mass by a plurality of second elastic beams, comprising the following steps:

(i) growing an epilayer on a top silicon layer of a silicon on insulator (SOI) silicon wafer having the top silicon layer, a bottom silicon layer, and a buried oxide layer between the top silicon layer and the bottom silicon layer;

(ii) growing, by use of thermal oxidation or chemical deposition, a silicon dioxide layer on the surfaces of the top silicon layer and a bottom silicon layer;

(iii) removing, by use of photolithography and etching, a portion of the silicon dioxide layer, which is on the surface of the bottom silicon layer, and exposing a portion of the bottom silicon layer;

(iv) forming, by depositing silicon nitride on the surface of the silicon dioxide layer, a silicon nitride layer;

(v) removing, by use of photolithography and etching, an outer portion of the silicon nitride layer and the silicon dioxide layer, which are on the surface of the bottom silicon layer, and exposing a portion of the bottom silicon layer;

(vi) removing, by use of photolithography and etching, an inner portion of the silicon nitride layer, which is on the surface of the bottom silicon layer, and exposing the silicon dioxide layer;

(vii) etching the exposed outer portion of the bottom silicon layer to a certain depth to form a portion of an outer frame;

(viii) removing, by use of etching, the exposed inner portion of the silicon dioxide layer, and exposing the bottom silicon layer;

(ix) further etching the exposed portion of the bottom silicon layer until exposing the buried oxide layer at the outer portion of the bottom silicon layer, thus forming the outer frame and the inner frame;

(x) removing, by use of etching, the buried oxide layer at the outer portion of the bottom silicon layer; and further etching the exposed portion of the bottom silicon layer, until exposing the buried oxide layer at the inner portion of the bottom silicon layer, thus forming a plurality of second elastic beams;

(xi) removing the silicon nitride layer on the surface of the bottom silicon layer, and etching the outer portion of the bottom silicon layer to the epilayer, thus forming a plurality of first elastic beams, while at the same time etching a center portion of the bottom silicon layer to a certain thickness, thus forming a gap space;

(xii) removing the silicon dioxide layer on the surface of the bottom silicon layer, and bonding together, by a back-to-back silicon bonding, two etched silicon on insulator silicon wafers thereby forming a bonded wafer structure;

(xiii) forming, by use of photolithography and etching, a plurality of holes, with depth from silicon nitride layer to the epilayer, on the surface of top silicon layer;

(xiv) forming, by performing etching to the holes, a plurality of through holes, thus forming the freely moveable first and second elastic beams;

(xv) removing the silicon nitride layer and the silicon dioxide layer on the surfaces of the bonded wafer structure thereby forming the top level measurement structure and the bottom level measurement structure; and (xvi) bonding the top cap silicon wafer to the top level measurement structure and bonding the bottom cap silicon wafer to the bottom level measurement structure.

2. The fabrication technique of claim 1, wherein the fabrication technique for the top cap silicon wafer and bottom cap silicon wafer further comprises:

A. forming, by use photolithography, etching, a plurality of through holes on the top cap silicon wafer or the bottom cap silicon wafer;

B. forming, by use photolithography, etching, a recess area on each bonding surface of the top cap silicon wafer and the bottom cap silicon wafer;

C. before the bonding step, cleaning the top cap silicon wafer and the bottom cap silicon wafer; and D. after the bonding step, depositing metal on the surfaces of the top cap silicon wafer and the bottom cap silicon wafer to form electrodes, and depositing metal on the surface of the silicon on insulator silicon wafer through the through holes formed on the top cap silicon wafer or the bottom cap silicon wafer, to form electrodes from the through holes.

3. The fabrication technique of claim 1, wherein etching the silicon layer is performed with one or more of the following etchants: potassium hydroxide, tetramethylammonium hydroxide, ethylenediamine pyrocatechol or gaseous xenon difluoride.

4. The fabrication technique of claim 1, wherein etching the silicon dioxide layer is performed with one or more of the following etchants: buffered hydrofluoric acid, 49% hydrofluoric acid by weight or gaseous hydrogen fluoride.

5. The fabrication technique of claim 1, wherein the etching steps are performed using dry etching or wet etching.

6. The fabrication technique of claim 5, wherein dry etching includes silicon reactive ion etching or reactive ion etching.

7. A method for fabricating a tri-axial MEMS accelerometer, the accelerometer including a top level measurement structure having a top cap silicon wafer and a bottom level measurement structure having a bottom cap silicon wafer, each measurement structure including an outer frame, an inner frame enclosed within the outer frame, a mass coupled with the inner frame, and a comb electrode structure between the mass and the inner frame, wherein the comb electrode structure on the top level measurement structure is oriented orthogonally to the corresponding comb electrode structure on the bottom level measurement structure, and wherein the inner frame is coupled with the outer frame by a plurality of first elastic beams, and the inner frame is coupled to the mass by a plurality of second elastic beams, comprising:

(i) growing an epilayer on a top silicon layer of a silicon on insulator (SOI) silicon wafer having the top silicon layer, a bottom silicon layer, and a buried oxide layer between the top silicon layer and the bottom silicon layer;

(ii) growing a silicon dioxide layer on the surfaces of the top silicon layer and a bottom silicon layer;

(iii) removing a portion of the silicon dioxide layer, which is on the surface of the bottom silicon layer, and exposing a portion of the bottom silicon layer;

(iv) forming a silicon nitride layer on the surface of the silicon dioxide layer;

(v) removing an outer portion of the silicon nitride layer and the silicon dioxide layer, which are on the surface of the bottom silicon layer, and exposing a portion of the bottom silicon layer;

(vi) removing an inner portion of the silicon nitride layer, which is on the surface of the bottom silicon layer, and exposing the silicon dioxide layer;

(vii) etching the exposed outer portion of the bottom silicon layer to a certain depth to form an outer frame;

(viii) removing the exposed inner portion of the silicon dioxide layer, and exposing the bottom silicon layer;

(ix) further etching the exposed portion of the bottom silicon layer until exposing the buried oxide layer at the outer portion of the bottom silicon layer, thus forming the outer frame and the inner frame;

(x) removing the buried oxide layer at the outer portion of the bottom silicon layer; and further etching the exposed portion of the bottom silicon layer, until exposing the buried oxide layer at the inner portion of the bottom silicon layer, thus forming the second elastic beams, while at the same time, etching a center portion of the bottom silicon layer to a certain thickness, thus forming the gap space;

(xi) removing the silicon dioxide layer on the surface of the bottom silicon layer, and bonding two etched silicon on insulator silicon wafers thereby forming a bonded wafer structure;

(xii) forming a plurality of holes, with depth from silicon nitride layer to the epilayer, on the surface of top silicon layer;

(xiii) forming a plurality of through holes in the holes, thus forming the freely moveable first and second elastic beams;

(xiv) removing the silicon nitride layer and the silicon dioxide layer on the surfaces of the bonded wafer structure, and thereby forming a top level measurement structure and a bottom level measurement structure; and (xv) bonding the top cap silicon wafer to the top level measurement structure and bonding the bottom cap silicon wafer to the bottom level measurement structure.

* * * * *